(12) United States Patent
Fujihara

(10) Patent No.: US 11,199,575 B2
(45) Date of Patent: Dec. 14, 2021

(54) PROBER AND PROBE CARD PRECOOLING METHOD

(71) Applicant: Tokyo Electron Limited, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/990,660

(22) Filed: Aug. 11, 2020

(65) Prior Publication Data
US 2021/0048475 A1 Feb. 18, 2021

(30) Foreign Application Priority Data

Aug. 14, 2019 (JP) .............................. JP2019-148919

(51) Int. Cl.
*G01R 31/28* (2006.01)
*G01R 1/073* (2006.01)

(52) U.S. Cl.
CPC ..... *G01R 31/2865* (2013.01); *G01R 1/07307* (2013.01); *G01R 31/2887* (2013.01); *G01R 31/2891* (2013.01)

(58) Field of Classification Search
CPC ............ G01R 1/07307; G01R 1/07342; G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 6,111,421 A * | 8/2000 | Takahashi .......... | G01R 31/2868 324/750.04 |
| 2006/0201232 A1* | 9/2006 | Itakura ................. | G01N 27/223 73/1.02 |
| 2015/0145540 A1* | 5/2015 | Komatsu ............ | G01R 31/2874 324/750.03 |

FOREIGN PATENT DOCUMENTS

JP 2018-049989 A 3/2018

* cited by examiner

*Primary Examiner* — Tung X Nguyen
(74) *Attorney, Agent, or Firm* — Nath, Goldberg & Meyer; Jerald L. Meyer; Tanya E. Harkins

(57) ABSTRACT

A prober includes a plurality of inspection chambers, each of the plurality of inspection chambers including: a probe card having a plurality of probes; a probe card holder configured to hold the probe card; a chuck top configured to place a wafer on the chuck top; a seal mechanism configured to form a sealed space between the probe card holder and the chuck top; a temperature adjustor configured to adjust a temperature of the chuck top; and a gas supplier configured to supply a dry gas to the sealed space, and wherein, in a state in which no wafer is placed on the chuck top, the sealed space is purged with the dry gas, and precooling of the probe card is performed by cold heat of the chuck top having a temperature adjusted by the temperature adjustor.

7 Claims, 11 Drawing Sheets

PROBER AND PROBE CARD PRECOOLING METHOD

CROSS-REFERENCE TO RELATED APPLICATION(S)

This application is based upon and claims the benefit of priority from Japanese Patent Application No. 2019-148919, filed on Aug. 14, 2019, the entire contents of which are incorporated herein by reference.

TECHNICAL FIELD

The present disclosure relates to a prober and a method of precooling a probe card.

BACKGROUND

A prober is an example of an inspection apparatus for inspecting a wafer on which a large number of semiconductor devices are formed. The prober includes a probe card having probes that are a plurality of columnar contact terminals. In the prober, each probe is brought into contact with an electrode pad or solder bump in a semiconductor device by bringing the wafer into contact with the probe card. Then, the prober supplies electricity to an electric circuit of the semiconductor device connected to the electrode pad or solder bump, thereby inspecting a conduction state of the electric circuit.

PRIOR ART DOCUMENT

Patent Document

Patent Document 1: Japanese laid-open publication No. 2018-049989

SUMMARY

A prober according to an aspect of the present disclosure includes a plurality of inspection chambers, each of the plurality of inspection chambers including: a probe card; a probe card holder; a chuck top; a seal mechanism; a temperature adjustor; and a gas supplier. The probe card has a plurality of probes. The probe card holder is configured to hold the probe card. The chuck top is configured to place a wafer on the chuck top. The seal mechanism is configured to form a sealed space between the probe card holder and the chuck top. The temperature adjustor is configured to adjust a temperature of the chuck top. The gas supplier is configured to supply a dry gas to the sealed space. In the prober, in a state in which no wafer is placed on the chuck top, the sealed space is purged with the dry gas, and precooling of the probe card is performed by cold heat of the chuck top having a temperature adjusted by the temperature adjustor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
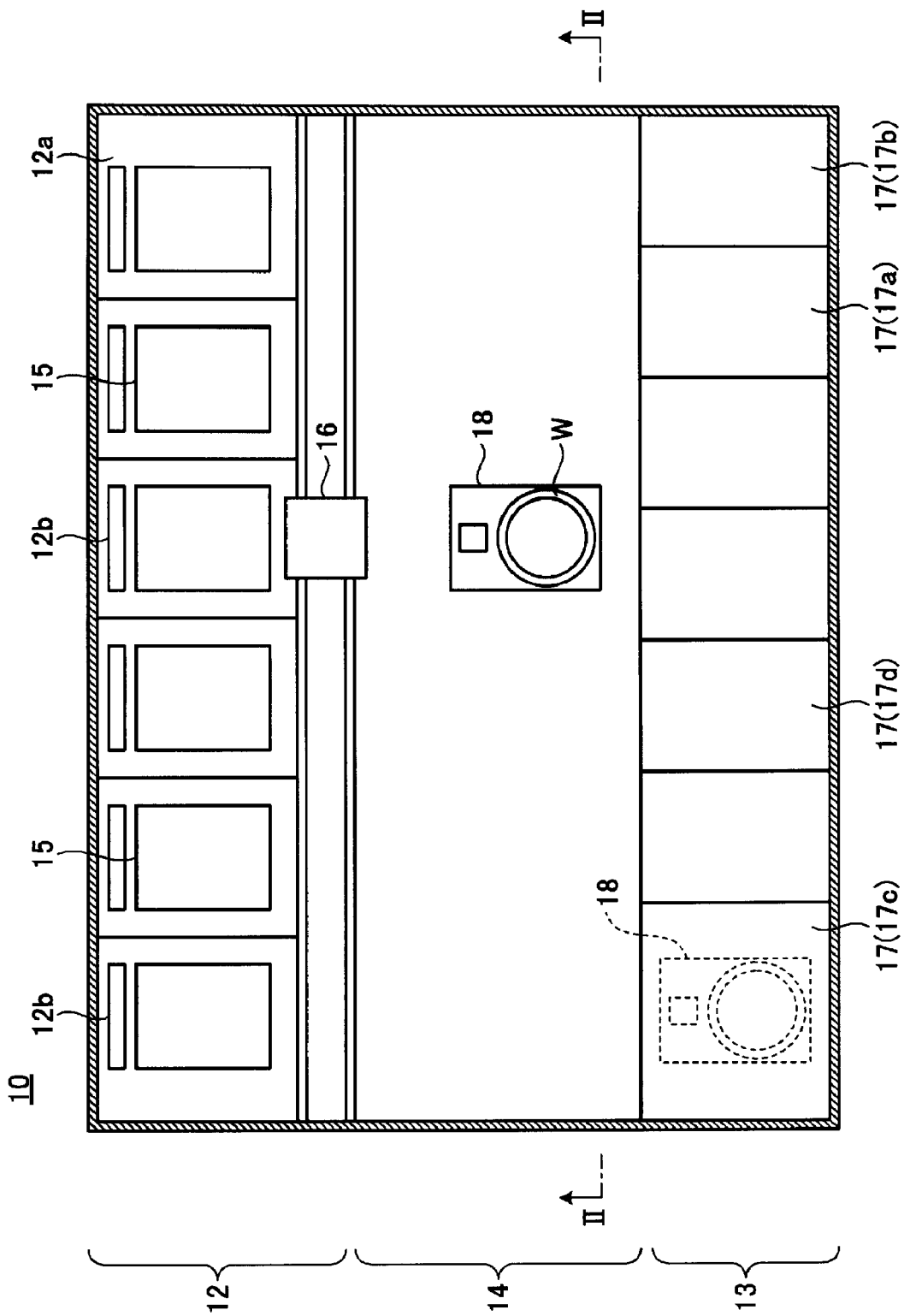
FIG. 1 is a view illustrating an exemplary prober according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a prober and a probe card precooling method disclosed herein will be described in detail with reference to the drawings. The technology disclosed herein is not limited by the following embodiments.

In recent years, in order to improve wafer inspection efficiency, there has been developed a prober that has a plurality of inspection chambers and is capable of inspecting semiconductor devices of a wafer in one inspection chamber while another wafer is being transferred to another inspection chamber by a transfer apparatus. In this prober, when a wafer is brought into contact with the probe card, a wafer is placed on a chuck top and a space between the probe card and the chuck top is vacuum-evacuated so as to bring the wafer into contact with the probe card. Here, when the wafer is brought into contact with the probe card, the chuck top is placed on a stage, and the stage moves the chuck top toward the probe card. Then, the chuck top is attracted onto the probe card and is separated from the stage.

However, in recent years, inspection conditions for inspecting a wafer have become complicated, and in particular, many inspections are performed under a high-temperature environment or a low-temperature environment. Among these, in an inspection under a low-temperature environment, in order to prevent dew condensation when a pressure in a vacuum-evacuated space is increased after completion of the inspection, it has been proposed to introduce dry air into the space. However, dew condensation may occur even in cases other than increasing the pressure in the vacuum-evacuated space. For example, dew condensation may occur when a probe card is precooled to an inspection temperature before inspecting a wafer. A precooling process in the present embodiment refers to cooling a probe card to a temperature below room temperature (e.g., to a temperature of −30 degrees C. to −10 degrees C.). The precooling process of the probe card is performed by, for example, radiant heat (cold heat) from the chuck top cooled to a low temperature. Thus, in some cases, dew condensation may occur on the chuck top, components around the chuck top, and the like. For example, when a probe card is transferred from outside a space having a low dew point, since the probe card contains moist air, dew condensation may occur when the precooling process is performed as it is. For this reason, it is required to precool a probe card while suppressing an occurrence of dew condensation.

[Configuration of Prober]

Figure 2:
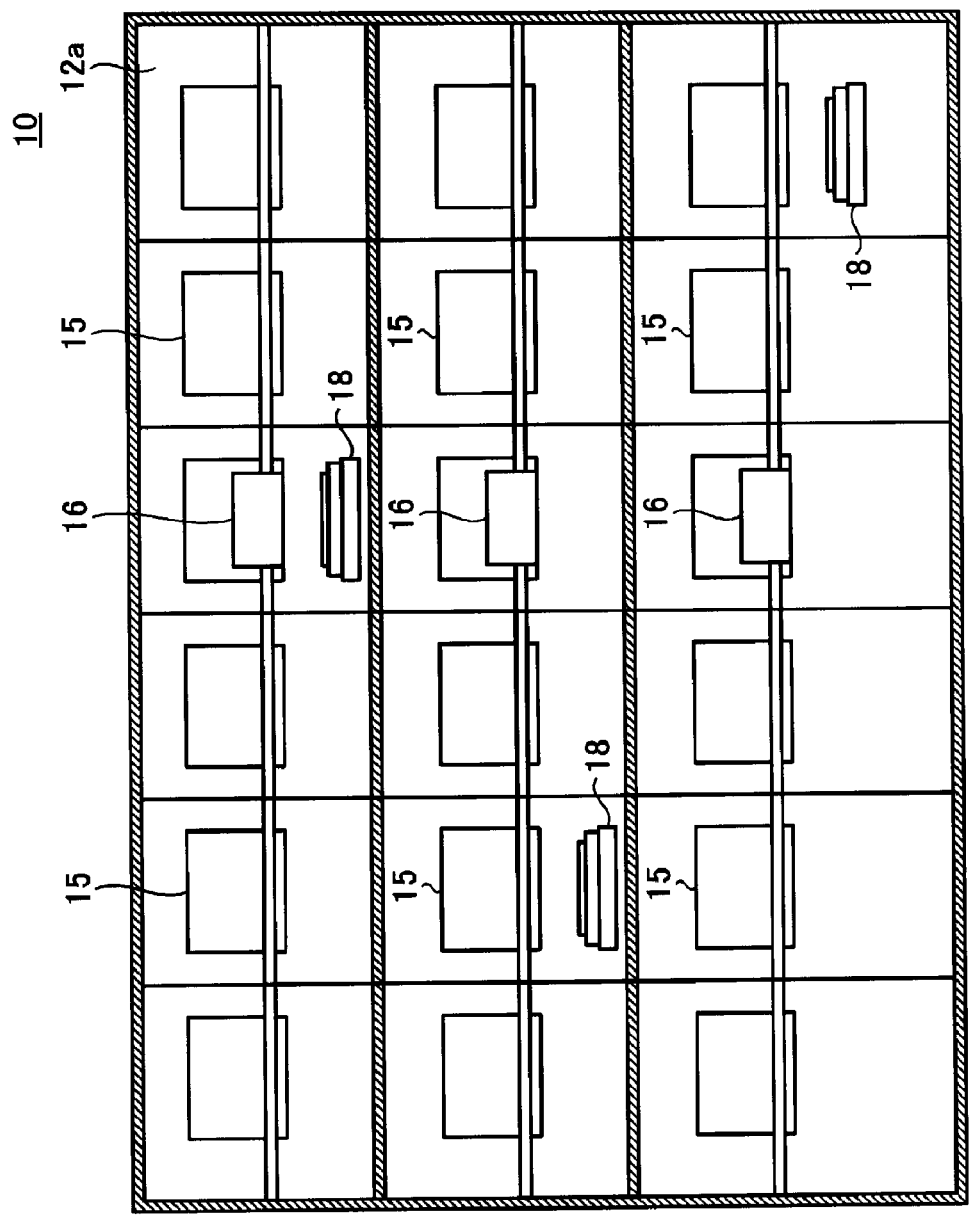
FIG. 2 is a cross-sectional view taken along line II-II in FIG. 1.

FIG. 1 is a view illustrating an exemplary prober according to an embodiment of the present disclosure. FIG. 2 is a cross-sectional view taken along line II-II in FIG. 1. A prober 10 illustrated in FIGS. 1 and 2 includes an inspection region 12 in which an electrical characteristic inspection of each semiconductor device of a wafer W is performed, an accommodation region 13 in which the wafer W is accommodated, and a transfer region 14 provided between the inspection region 12 and the accommodation region 13.

In the inspection region 12, a plurality of testers 15, each serving as a wafer inspection interface, is disposed, and a plurality of inspection chambers 12a corresponding to respective testers 15 is provided. Specifically, the inspection region 12 has a three-layer structure, in which each layer includes a tester row formed by a plurality of horizontally arranged testers, and one tester-side camera 16 is arranged correspondingly to each tester row. Each tester-side camera 16 moves horizontally along the corresponding tester row, and is positioned in front of each tester 15 so as to identify positions of a wafer W and the like and a degree of inclination of a chuck top 29. In addition, each inspection chamber 12a is provided with a supplier 12b that supplies a dry gas to the chuck top 29 to be described later. The supplier 12b supplies, for example, dry air as the dry gas.

The accommodation region 13 is divided into a plurality of accommodation spaces 17. A port 17a, an aligner 17b, a loader 17c, and a controller 17d are disposed in each accommodation space 17. The port 17a receives a front opening unified pod (FOUP), which is a container accommodating a plurality of wafers. The aligner 17b performs a position alignment of the wafers. A probe card 19 is loaded into and unloaded from the loader 17c. The controller 17d controls operations of respective components.

In the transfer region 14, a transfer apparatus 18 configured capable of moving to the inspection region 12 and the accommodation region 13 is disposed. The transfer apparatus 18 receives a wafer W from the port 17a and transfers the wafer W to each inspection chamber 12a, and also transfers a wafer W, on which an electrical characteristic inspection of semiconductor devices has been completed, from each inspection chamber 12a to the port 17a.

While the transfer apparatus 18 transfers one wafer W between one inspection chamber 12a and the port 17a, an electrical characteristic inspection of each semiconductor device on another wafer W can be performed in another inspection chamber 12a. Therefore, it is possible to improve wafer inspection efficiency.

Figure 3:
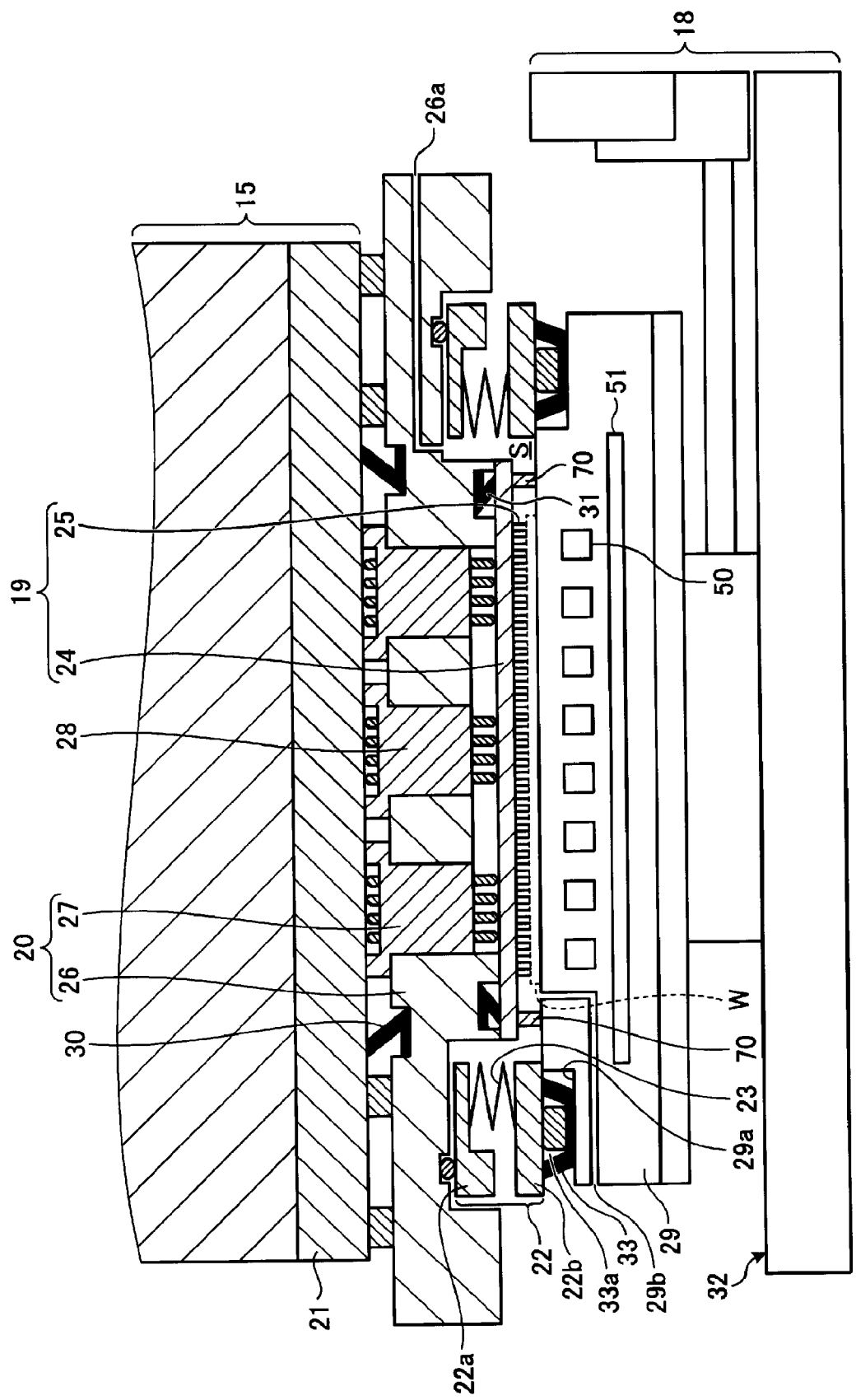
FIG. 3 is a view illustrating an exemplary configuration of a prober in a state in which no wafer is placed on a chuck top according to an embodiment.
Figure 4:
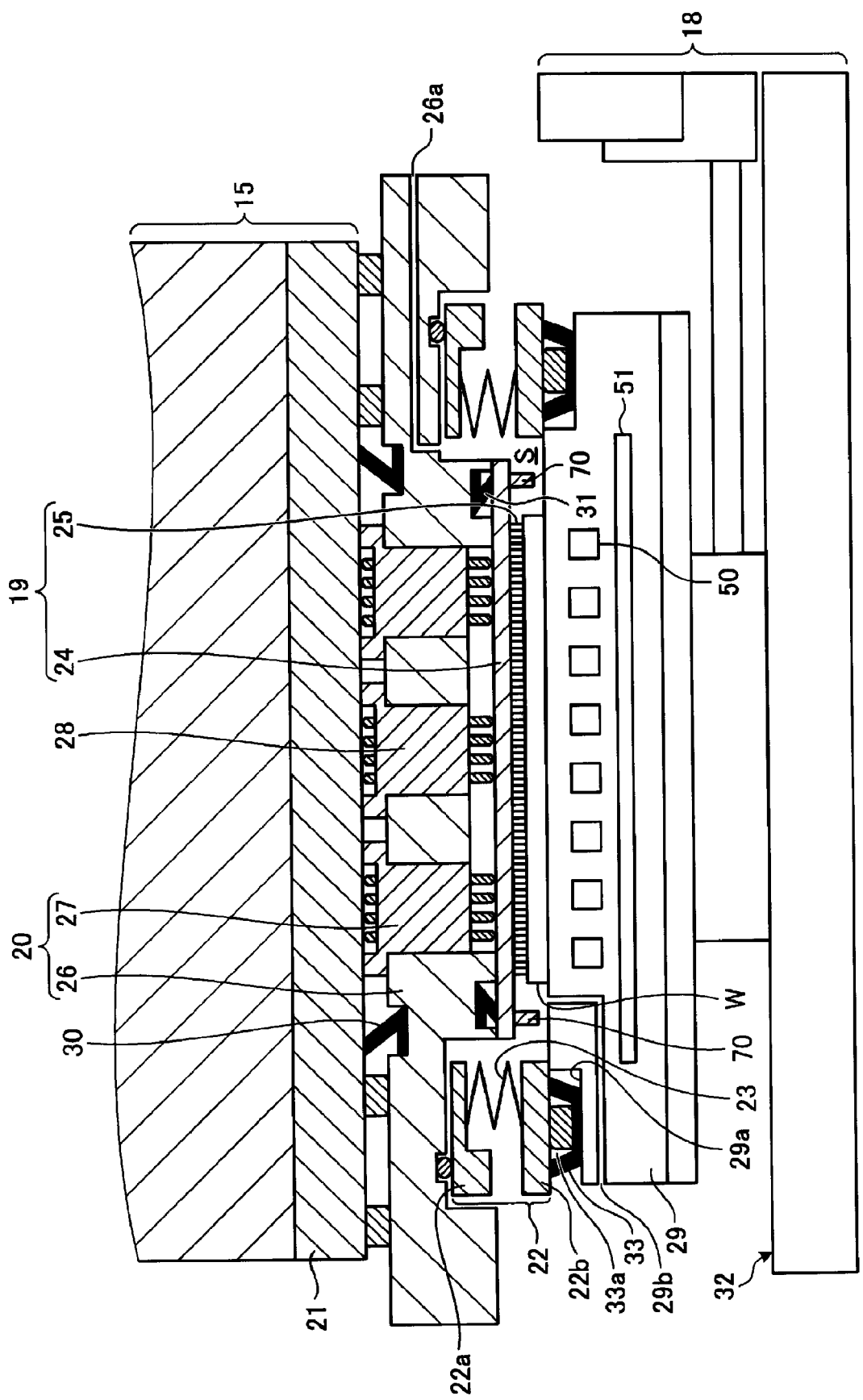
FIG. 4 is a view illustrating an exemplary configuration of a prober in a state in which a wafer is placed on a chuck top according to an embodiment.

FIG. 3 is a view illustrating an exemplary configuration of a prober in the state in which no wafer is placed on a chuck top according to the present embodiment. FIG. 3 illustrates the state in which the wafer W is not placed on the chuck top 29 in order to precool the probe card 19. That is to say, FIG. 3 illustrates a state in which the chuck top 29 is brought into contact with a gap adjustor 70 provided on the probe card 19, and mainly illustrates a configuration of the inspection chamber 12a in a cross-sectional view. FIG. 4 is a view illustrating an exemplary configuration of a prober in a state in which a wafer is placed on a chuck top according to the present embodiment. That is to say, FIG. 4 illustrates a state in which the wafer W is brought into contact with the probe card 19, and mainly illustrates a configuration of the inspection chamber 12a in a cross-sectional view.

In FIGS. 3 and 4, the tester 15 is installed on a pogo frame 20 fixed to an apparatus frame (not illustrated). The probe card 19 is attached below the pogo frame 20. A flange 22 is disposed so as to surround the probe card 19.

The probe card 19 includes a disk-shaped body 24, a plurality of electrodes (not illustrated) disposed on substantially entire of a top surface of the body 24, and a plurality of probes 25 disposed so as to protrude downwards from a bottom surface of the body 24. Each electrode is connected to a corresponding probe 25. When the wafer W is in contact with the probe card 19, each probe 25 is in contact with an electrode pad or a solder bump of each semiconductor device formed on the wafer W.

In addition, the probe card 19 has the gap adjustor 70 configured to maintain a gap between the probe card 19 and the chuck top 29 constant when the wafer W is not placed on the chuck top 29. The gap adjustor 70 has, for example, a pin shape, and is formed of stainless steel, aluminum, or copper. Three or more of the gap adjustor 70 are provided on the bottom surface of the probe card 19. The gap adjustor 70 may be, for example, a resin such as poly ether ether ketone (PEEK), or other materials or alloys. A length of the gap adjustor 70 is longer than that of the probe 25, and is shorter than a distance from the bottom surface of the body 24 of the probe card 19 to the top surface of the chuck top 29 in a state in which the probes 25 are in contact with the wafer W when the wafer W is placed on the chuck top 29.

That is to say, as illustrated in FIG. 3, the gap adjustor 70 is in contact with the chuck top 29 in the state in which the wafer W is not placed on the chuck top 29. On the other hand, as illustrated in FIG. 4, the gap adjustor 70 forms a gap between the gap adjustor 70 and the chuck top 29 when the wafer W is placed on the chuck top 29. In other words, in the state in which the wafer W is not placed on the chuck top 29, the probes 25 are not in contact with the chuck top 29, and in the state in which the wafer W is placed on the chuck top 29, the probes 25 are in contact with the wafer W. The gap adjustor 70 may be provided on the side of the chuck top 29.

The pogo frame 20 includes a substantially flat plate-shaped body 26 and a plurality of pogo block insertion holes 27, which are through holes perforated in the vicinity of a central portion of the body 26, and a pogo block 28 on which a plurality of pogo pins is arranged is inserted into each pogo block insertion hole 27. Each pogo block 28 is connected to an inspection circuit (not illustrated) included in the tester 15, and is in contact with a plurality of electrodes on the top surface of the body 24 of the probe card 19 mounted on the pogo frame 20. The pogo block 28 supplies an electric current to each probe 25 of the probe card 19 connected to a corresponding electrode, and also supplies, to the inspection circuit, an electric current flowing from the electric circuit of each semiconductor device of the wafer W through each probe 25.

The flange 22 has an upper flange 22a and a lower flange 22b. In addition, the flange 22 has a cylindrical bellows 23 between the upper flange 22a and the lower flange 22b. The upper flange 22a is engaged with the pogo frame 20, and is sealed using, for example, a packing. The lower flange 22b is movable in a vertical direction with respect to the pogo frame 20.

Until the chuck top 29 is brought into contact with the lower flange 22b, the lower flange 22 moves downwards by its own weight such that a bottom surface of the lower flange 22b is located below a tip end of each probe 25 of the probe card 19. The bellows 23 is a metallic bellows structure, and is configured to be extendable in the vertical direction. A lower end and an upper end of the bellows 23 are in close contact with a top surface of the lower flange 22b and a bottom surface of the upper flange 22a, respectively.

A space between the pogo frame 20 and a base 21 of the tester 15 is sealed by a seal member 30, and by vacuum-evacuating the space, the base 21 is attached to the pogo frame 20. A space between the pogo frame 20 and the probe card 19 is also sealed by a seal member 31, and by vacuum-evacuating the space, the probe card 19 is attached to the pogo frame 20.

The transfer apparatus 18 has an aligner 32. The chuck top 29 is placed on the aligner 32, and the wafer W is placed on an upper surface of the chuck top 29. In FIG. 3, the wafer W is not placed on the chuck top 29, and a placement position is indicated by a broken line. The chuck top 29 is vacuum-suctioned to the aligner 32, and the wafer W is vacuum-suctioned to the chuck top 29. Accordingly, when the transfer apparatus 18 moves, it is possible to prevent the wafer W from moving relative to the transfer apparatus 18. A method of holding the chuck top 29 and the wafer W is not limited to vacuum suction, as long as relative movements of the chuck top 29 and the wafer W with respect to the aligner 32 can be prevented. For example, a method of holding the chuck top 29 and the wafer W using electromagnetic attraction or a clamp may be used. In addition, a step 29a is formed in a peripheral edge portion of the top surface of the chuck top 29, and a seal mechanism 33 is disposed on the step 29a.

The seal mechanism 33 is suctioned to the lower flange 22b by vacuum-evacuating a sealed space 33a, which is formed in the seal mechanism 33 when the seal mechanism 33 is in contact with the bottom surface of the lower flange 22b. That is to say, by holding the chuck top 29 by the flange 22 via the seal mechanism 33, a sealed space S is formed between the pogo frame 20 or the probe card 19 and the chuck top 29.

In addition, the chuck top 29 includes a flow path 50 and a heater 51 provided in the chuck top 29. A coolant is supplied to the flow path 50 from a chiller unit (not illustrated). The coolant supplied to the flow path 50 flows through the flow path 50 and then returns to the chiller unit. A heater power source (not illustrated) is connected to the heater 51, and when an electric power is supplied to the heater 51, the chuck top 29 is heated. A temperature of the chuck top 29 is adjusted by cooling by the coolant circulating in the flow path 50 and heating by the heater 51.

The transfer apparatus 18 can move to a position below the probe card 19 in the inspection chamber 12a so as to make the wafer W placed on the chuck top 29 face the probe card 19, and can move the wafer W towards the probe card 19. The sealed space S is a space formed when the gap adjustor 70 is in contact with a mounting surface of the chuck top 29 (see FIG. 3), or when the chuck top 29 is in contact with the lower flange 22b and the wafer W is in contact with the probe card 19 (see FIG. 4). Also, the sealed space S is a space formed when the chuck top 29 is in contact with the lower flange 22b before the probe card 19 is transferred (see FIG. 5) or after the probe card 19 is vacuum-suctioned to the pogo frame 20 (see FIG. 6), which will be described later.

In the sealed space S, the chuck top 29 is held on the side of the probe card 19 by vacuum-evacuating the sealed space S via a vacuum line 26a. The method of holding the chuck top 29 is not limited to vacuum suction, as long as the sealed space S cab be formed. For example, a method of holding the chuck top 29 using electromagnetic attraction or a clamp may be used. In addition, in the sealed space S, dry air is supplied to the sealed space S via a dry air line 29b before the chuck top 29 is held on the side of the probe card 19 by vacuum suction via the vacuum line 26a. The supplied dry air is discharged from the vacuum line 26a, whereby moist air in the sealed space S is purged. The movement of the transfer apparatus 18 is controlled by the controller 17d, and the controller 17d recognizes a position and an amount of movement of the transfer apparatus 18.

The aligner 32 adjusts a relative position and inclination of the chuck top 29 with respect to the probe card 19. A temperature adjustor, such as the flow path 50 or the heater 51, realizes an inspection under a high-temperature environment or a low-temperature environment. Therefore, in an inspection under a high-temperature environment or a low-temperature environment, the aligner 32 adjusts the position and inclination of the probe card 19 and the chuck top 29 according to deformation of the probe card 19 and the chuck top 29 caused by heat radiation from the heater 51 or heat absorption to the flow path 50. A temperature range of the chuck top 29 may be, for example, 130 degrees C. to −30 degrees C.

The aligner 32 has bases corresponding to X, Y, and Z directions, respectively, and rail-shaped guides. Each base is movable along each guide. A Z block provided on the Z base is provided with a substantially disk-shaped chuck base. The chuck base has a chuck top suction surface on a top surface of the chuck base, and the chuck top 29 is vacuum-suctioned to the chuck top suction surface. As a result, the chuck top 29 is placed and attached on the aligner 32. At this time, a position of the chuck top 29 with respect to the chuck base is defined using, for example, positioning pins or a positioning block.

In addition, the aligner 32 has an upper identification camera for identifying degrees of inclination of the probe card 19 and the pogo frame 20. In addition, the aligner 32 is capable of adjusting the inclination of the chuck top 29 placed on the chuck base by lifting the chuck base using an actuator.

[Purging Sealed Space S]

Figure 5:
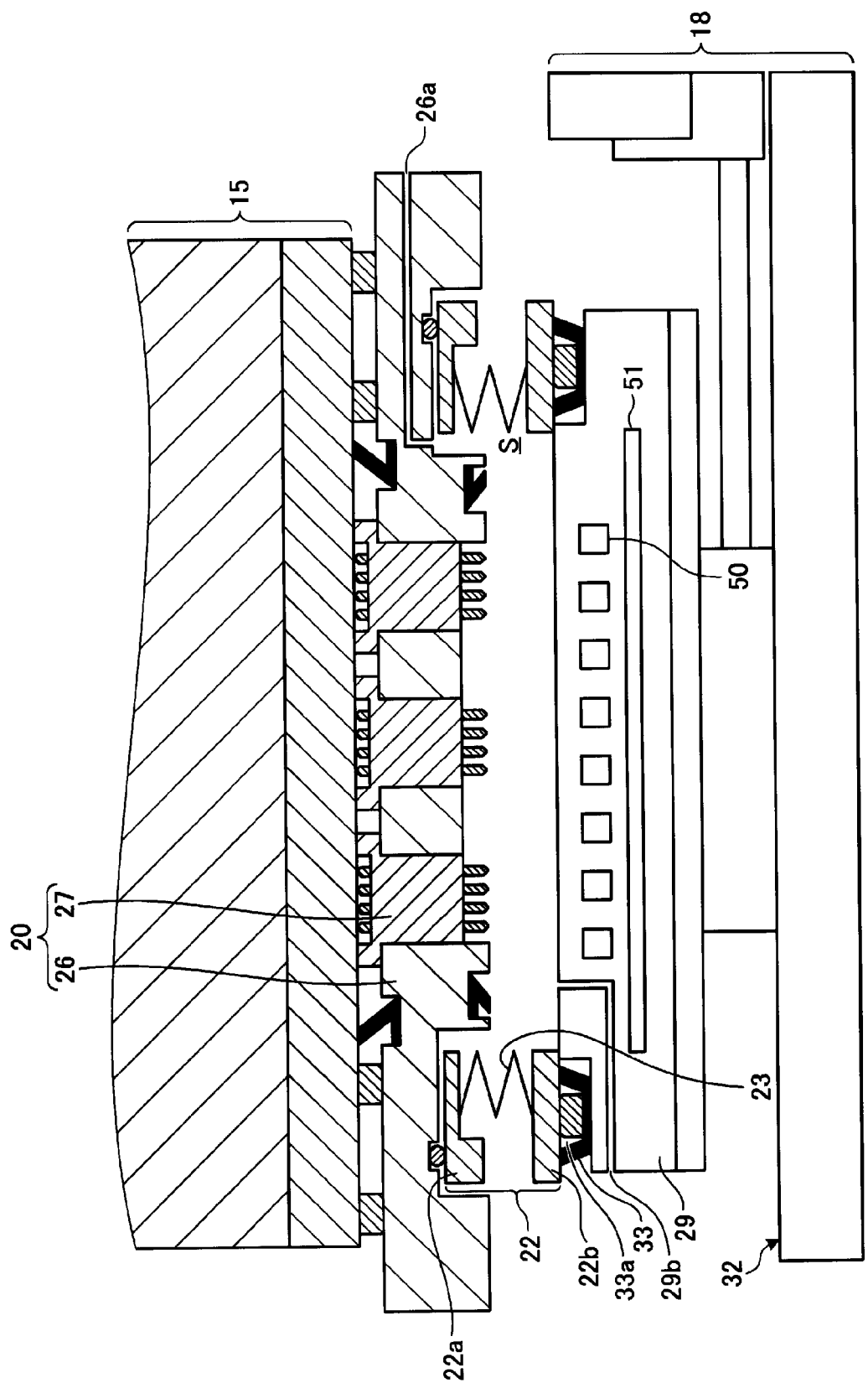
FIG. 5 is a view illustrating an exemplary configuration of a prober in a state in which a sealed space is purged before a probe card according to an embodiment is transferred.

Next, purging the sealed space S will be described with reference to FIGS. 5 and 6. FIG. 5 is a view illustrating an exemplary configuration of a prober in a state in which a sealed space is purged before a probe card according to the present embodiment is transferred. That is to say, FIG. 5 illustrates a state in which the probe card 19 has not yet been transferred and the wafer W is not placed on the chuck top 29, for example, after maintenance, and mainly illustrates a configuration of the inspection chamber 12a in a cross-sectional view.

In the state illustrated in FIG. 5, the chuck top 29 is raised to a position where the seal mechanism 33 is brought into contact with the lower flange 22b and the sealed space 33a is vacuum-evacuated, whereby the sealed space S is formed. That is to say, the chuck top 29 is not vacuum-suctioned to the side of the pogo frame 20 in the sealed space S, but the sealed space S is sealed by the seal mechanism 33. In this state, the sealed space S is purged with dry air supplied through the dry air line 29b. That is to say, in a state in which the pogo frame 20, which is a probe card holder, does not hold the probe card 19, the sealed space S is formed by the seal mechanism 33, and the formed sealed space S is purged with dry air. In addition, a flow rate of the dry air is, for example, about 2 L/minute. Thus, it possible to purge moist air in the sealed space S, for example, after maintenance.

Figure 6:
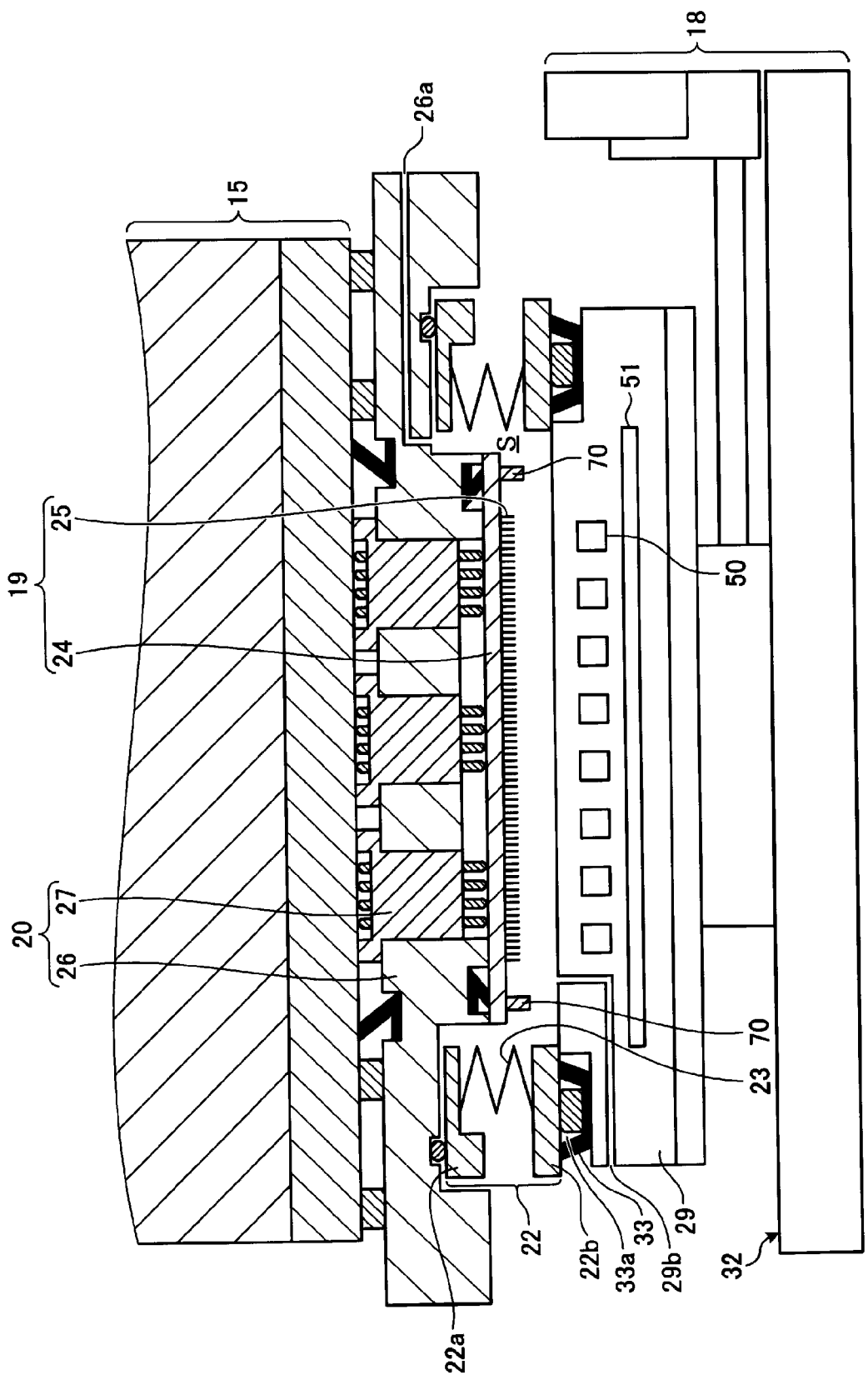
FIG. 6 is a view illustrating an exemplary configuration of a prober in a state in which a sealed space in which a probe card according to the present embodiment is vacuum-suctioned is purged.

FIG. 6 is a view illustrating an exemplary configuration of a prober in a state in which a sealed space in which a probe card according to the present embodiment is vacuum-suctioned is purged. That is to say, FIG. 6 illustrates a state in which the probe card 19 has been vacuum-suctioned and the chuck top 29 on which the wafer W is not placed has not yet been vacuum-suctioned, and mainly illustrates a configuration of the inspection chamber 12a in a cross-sectional view.

In the state illustrated in FIG. 6, like FIG. 5, the chuck top 29 is raised to a position where the seal mechanism 33 is brought into contact with the lower flange 22b and the sealed space 33a is vacuum-evacuated, whereby the sealed space S is formed. That is to say, the chuck top 29 is not vacuum-suctioned to the side of the probe card 19 in the sealed space S, but the sealed space S is sealed by the seal mechanism 33. In this state, the sealed space S is purged with dry air supplied through the dry air line 29b. That is to say, from the state of FIG. 5, once the sealed space S is opened, the probe card 19 is transferred to a lower portion of the pogo frame 20, and the probe card 19 is held by the pogo frame 20. Subsequently, the chuck top 29 on which the wafer W is not placed is transferred to a location below the probe card 19, and is raised again to the position at which the seal mechanism 33 is brought into contact with the lower flange 22b, whereby the sealed space 33a is vacuum-evacuated to form the sealed space S. At this time, the gap adjustor 70 is not in contact with the chuck top 29. Then, the sealed space S is purged with the dry air. As a result, water inside the probe card 19 can also be blown away.

[Probe Card Precooling Method]

Figure 7:
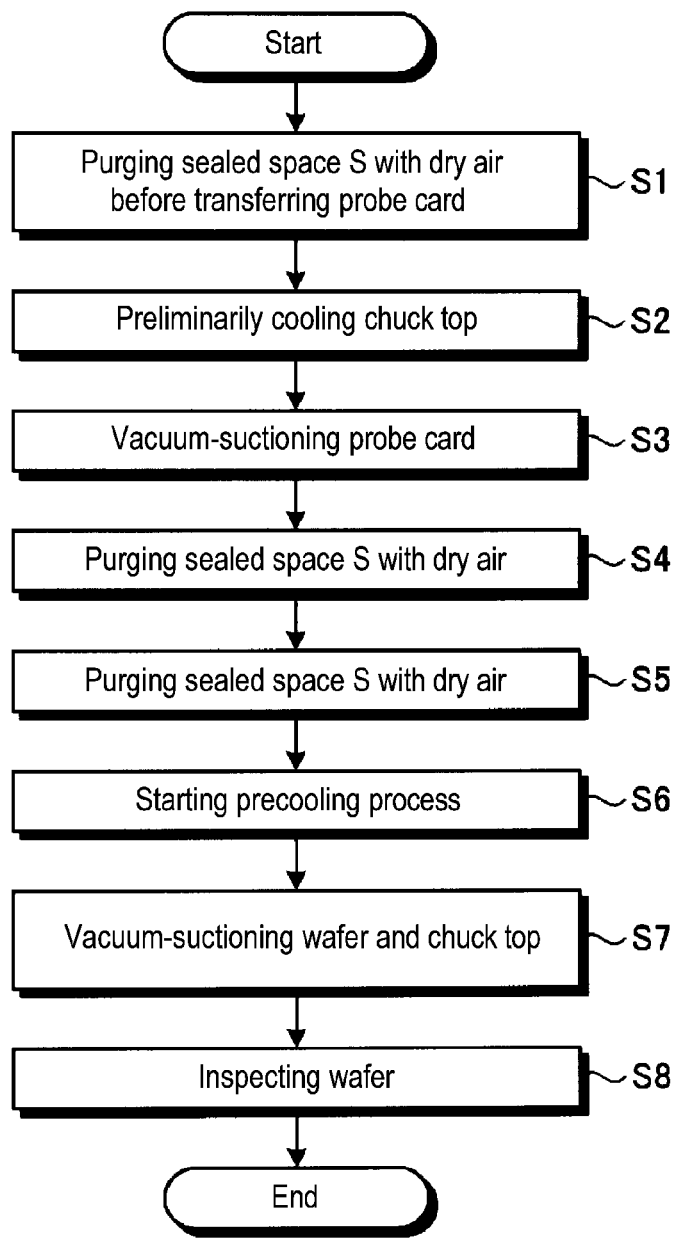
FIG. 7 is a flowchart illustrating an exemplary probe card precooling method according to an embodiment.

Next, a probe card precooling method according to the present embodiment will be described. FIG. 7 is a flowchart illustrating an exemplary probe card precooling method according to the present embodiment.

First, before the probe card 19 is transferred to the inspection chamber 12a in which a precooling process of the probe card 19 is performed, the chuck top 29 is transferred to the inspection chamber 12a by using the transfer apparatus 18. At this time, no wafer is placed on the chuck top 29. The chuck top 29 is transferred to a location below the pogo frame 20 by using the transfer apparatus 18. The chuck top 29 is raised to the position where the seal mechanism 33 is brought into contact with the lower flange 22b, by using the transfer apparatus 18, and the sealed space 33a in the seal mechanism 33, which is in contact with the lower flange 22b, is vacuum-evacuated to form the sealed space S (see FIG. 5). At this time, the chuck top 29 is held by the flange 22 via the seal mechanism 33, and the sealed space S is sealed by the seal mechanism 33. In this state, the sealed space S is purged with the dry air supplied through the dry air line 29b (step S1).

The transfer apparatus 18 is retracted from the inspection chamber 12a, and the chiller unit and the heater power source (not illustrated), which are connected to the flow path 50 and the heater 51, respectively, are controlled to start a temperature control such that the chuck top 29 has the same temperature as that during the precooling process. That is to say, the chuck top 29 is preliminarily cooled before the probe card 19 is transferred (step S2). The radiant heat (cold heat) from the chuck top 29 also cools other components such as the pogo frame 20.

Subsequently, the probe card 19 is transferred from the loader 17c to the inspection chamber 12a in which the precooling process of the probe card 19 is performed, by using the transfer apparatus 18. The probe card 19 is vacuum-suctioned from the transfer apparatus 18 to the pogo frame 20 (step S3).

The chuck top 29 is transferred to the probe card 19, which is to be precooled, by using the transfer apparatus 18. At this time, no wafer is placed on the chuck top 29. The chuck top 29 is transferred to a location below the probe card 19 by using the transfer apparatus 18. The chuck top 29 is raised to the position where the seal mechanism 33 is brought into contact with the lower flange 22b, by using the transfer apparatus 18, and the sealed space 33a in the seal mechanism 33, which is in contact with the lower flange 22b, is vacuum-evacuated to form the sealed space S (see FIG. 6). At this time, the sealed space S is in the state of being sealed by the seal mechanism 33. In this state, the sealed space S is purged with dry the air supplied through the dry air line 29b (step S4).

After purging the sealed space S, the chuck top 29 is further raised and brought into contact with the gap adjustor 70 of the probe card 19. In addition, the chuck top 29 is vacuum-suctioned to the side of the probe card 19 (step S5). At this time, the gap between the chuck top 29 and the probe card 19 is maintained constant by the gap adjustor 70 (see FIG. 3).

The transfer apparatus 18 is retracted from the inspection chamber 12a, and the chiller unit and the heater power source (not illustrated), which are connected to the flow path 50 and the heater 51, respectively, are controlled to start a precooling process of the probe card 19 (step S6).

When the precooling process of the probe card 19 is completed, the chuck top 29 is transferred from the inspection chamber 12a by using the transfer apparatus 18, and the wafer W is placed on the chuck top 29. The chuck top 29 on which the wafer W is placed is transferred to the inspection chamber 12a, and the wafer W and the chuck top 29 are vacuum-suctioned to the pogo frame 20 (step S7). The wafer W is inspected (step S8), and after the inspection is completed, the wafer W is transferred to, for example, the port 17a by using the transfer apparatus 18.

As described above, it is possible to precool the probe card 19 while suppressing occurrence of dew condensation. In addition, it is possible to precool the probe card 19 while maintaining the gap between the probe card 19 and the chuck top 29 constant. Furthermore, since the gap between the probe card 19 and the chuck top 29 is maintained constant, the precooling process of the probe card 19 can be performed in any of the inspection chambers 12a while stabilizing the precooling time.

[Modifications of Gap Adjustor]

Figure 8:
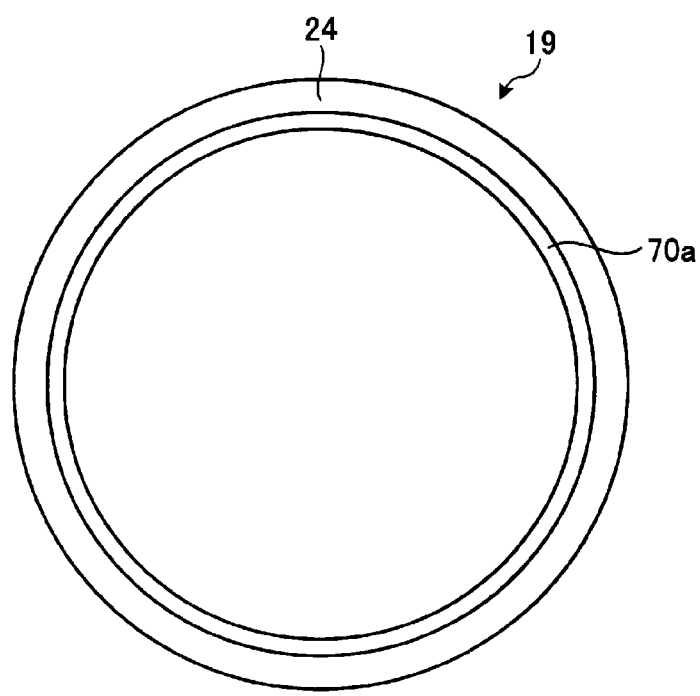
FIG. 8 is a view illustrating an exemplary configuration of a gap adjustor.
Figure 9:
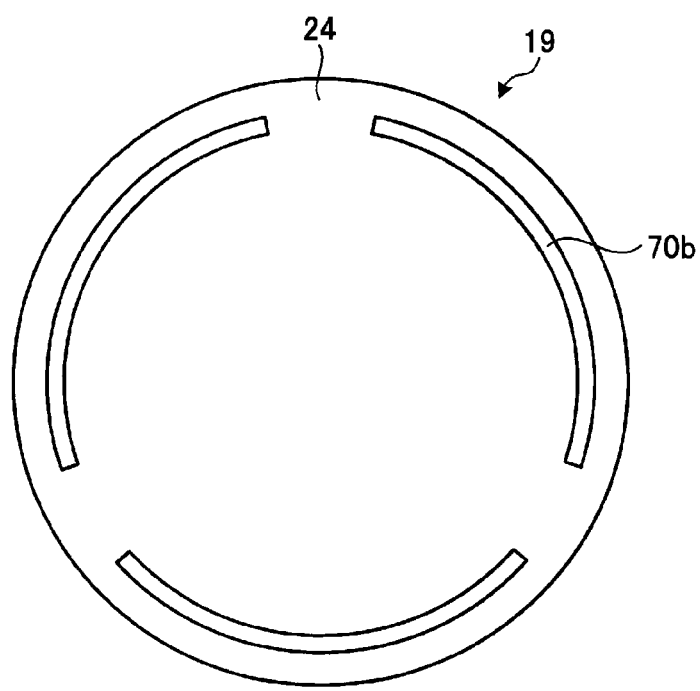
FIG. 9 is a view illustrating an exemplary configuration of a gap adjustor.
Figure 10:
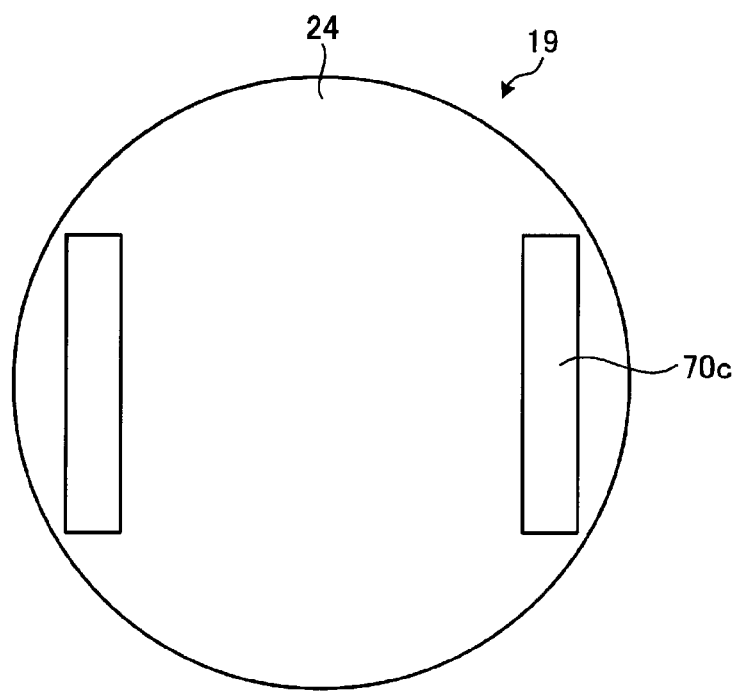
FIG. 10 is a view illustrating an exemplary configuration of a gap adjustor.
Figure 11:
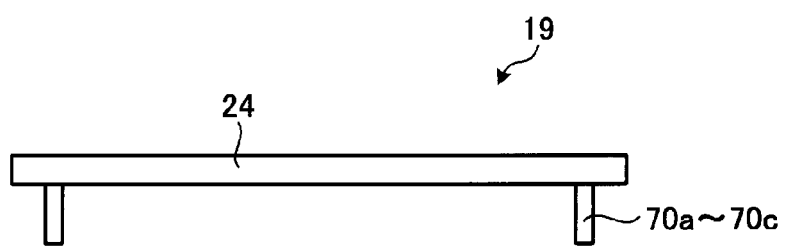
FIG. 11 is a view illustrating an exemplary cross section of a configuration of a gap adjustor.
Figure 12:
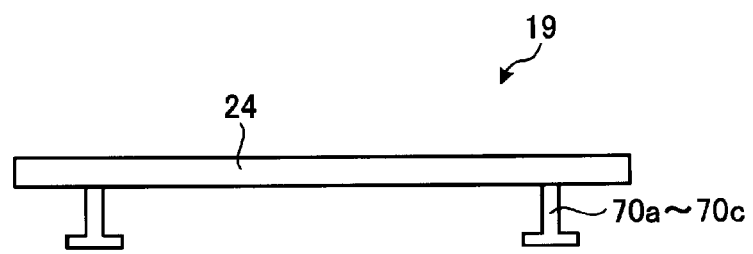
FIG. 12 is a view illustrating an exemplary cross section of a configuration of a gap adjustor.

Next, modifications of the gap adjustor 70 will be described. FIGS. 8 to 10 are views, each illustrating an exemplary configuration of the gap adjustor. FIGS. 11 and 12 are views, each illustrating an exemplary cross section of the configuration of the gap adjustor. As illustrated in each of FIGS. 8 to 10, each of the gap adjustors 70a to 70c is arranged on the bottom surface of the body 24 of the probe card 19 to face the front side in the drawing. In the cross section of the probe card 19 illustrated in each of FIGS. 11 and 12, each of the gap adjustors 70a to 70c is arranged on the bottom surface of the body 24 to face the lower side in the drawing. The gap adjustor 70a illustrated in FIG. 8 is an example in which the gap adjustor 70a is arranged in an annular shape on the side of the outer circumference of the probe card 19. The gap adjustor 70b illustrated in FIG. 9 is an example in which three arc-shaped gap adjustors 70b are arranged on the side of the outer circumference of the probe card 19. The gap adjustor 70c illustrated in FIG. 10 is an example in which two linear gap adjustors 70c are arranged at line symmetrical positions with respect to the center of the probe card 19.

FIG. 11 illustrates a cross section of the gap adjustors, each of which has a linear shape. FIG. 12 illustrates a cross section of the gap adjustors, each of which has an inverted T shape. Modifications of the gap adjustor 70 are not limited to the gap adjustors 70a to 70c, and other shapes and arrangements may be used.

As described above, according to the present embodiment, the prober 10 includes the plurality of inspection chambers 12a, and each of the inspection chambers 12a includes the probe card 19, the pogo frame 20 as a probe card holder, the chuck top 29, the seal mechanism 33, the temperature adjustor, and the supplier 12b. The probe card 19 has the plurality of probes 25. The pogo frame 20 holds the probe card 19. The chuck top 29 can place the wafer W on the chuck top 29. The seal mechanism 33 forms the sealed space S between the pogo frame 20 and the chuck top 29. The temperature adjustor adjusts the temperature of the chuck top 29. The supplier 12b supplies a dry gas to the sealed space S. In the prober 10, in a state in which no wafer W is placed on the chuck top 29, the probe card 19 is precooled by cold heat of the chuck top 29 having a temperature adjusted by the temperature adjustor, after the sealed space S is purged with a dry gas. Therefore, it is possible to precool the probe card while suppressing the occurrence of dew condensation.

According to the present embodiment, at least one of the probe card 19 and the chuck top 29 includes the gap adjustor 70 that maintains the gap between the probe card 19 and the chuck top 29 constant. The prober 10 purges the sealed space S with a dry gas in a state in which the probe card 19 and the chuck top 29 are not in contact with each other via the gap adjustor 70. Thereafter, the chuck top 29 is raised to the side of the probe card 19, and the precooling process is performed in a state in which the probe card 19 and the chuck top 29 are in contact with each other via the gap adjustor 70. Therefore, it is possible to precool the probe card 19 while maintaining the gap between the probe card 19 and the chuck top 29 constant.

According to the present embodiment, the length of the gap adjustor 70 is longer than that of the probe 25, and is shorter than the distance between the probe card 19 and the chuck top 29 in a state in which the probes 25 are in contact with a wafer W when the wafer W is placed on the chuck top 29. Therefore, it is possible to precool the probe card 19 while maintaining the gap between the probe card 19 and the chuck top 29 constant.

In addition, according to the present embodiment, the gap adjustor 70 has a pin shape, an annular shape, an arc shape, or a linear shape. Therefore, it is possible to maintain the gap between the probe card 19 and the chuck top 29 constant.

It shall be understood that the embodiments disclosed herein are illustrative and not limiting in all aspects. The above-described embodiments may be omitted, replaced, or modified in various forms without departing from the scope and spirit of the appended claims.

In the above-described embodiments, dry air is supplied from the dry air line 29b and is discharged from the vacuum line 26a, but the present disclosure is not limited thereto. For example, the dry air may be supplied and discharged using the vacuum line 26a without providing the dry air line 29b. In addition, for example, the vacuum line 26a may be provided on the side of the chuck top 29.

According to the present disclosure, it is possible to precool a probe card while suppressing occurrence of dew condensation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A prober comprising a plurality of inspection chambers, each of the plurality of inspection chambers comprising:
    a probe card having a plurality of probes;
    a probe card holder configured to hold the probe card;
    a chuck top configured to place a wafer on the chuck top;
    a seal mechanism configured to form a sealed space between the probe card holder and the chuck top;
    a temperature adjustor configured to adjust a temperature of the chuck top; and
    a gas supplier configured to supply a dry gas to the sealed space,
    wherein, in a state in which no wafer is placed on the chuck top, the sealed space is purged with the dry gas, and precooling of the probe card is performed by cold heat of the chuck top having a temperature adjusted by the temperature adjustor.

2. The prober of claim 1, wherein at least one of the probe card and the chuck top includes a gap adjustor configured to maintain a gap between the probe card and the chuck top to be constant, and
    wherein, after the sealed space is purged with the dry gas in a state in which the probe card and the chuck top are not in contact with each other via the gap adjustor, the chuck top is raised toward the probe card, and the precooling is performed in a state in which the probe card and the chuck top are in contact with each other via the gap adjustor.

3. The prober of claim 2, wherein the gap adjustor has a length longer than that of the probes, and is shorter than a distance between the probe card and the chuck top in a state in which the probes are in contact with the wafer when the wafer is placed on the chuck top.

4. The prober of claim 3, wherein the gap adjustor has a pin shape, an annular shape, an arc shape, or a linear shape.

5. The prober of claim 2, wherein the gap adjustor has a pin shape, an annular shape, an arc shape, or a linear shape.

6. A method of precooling a probe card in a prober that performs an inspection of a wafer, the method comprising:
    transferring a chuck top configured to hold the wafer to a location below the probe card having probes configured to be brought into contact with the wafer, in a state in which no wafer is placed on the chuck top;

forming a sealed space between a probe card holder configured to hold the probe card and the chuck top, by using a seal mechanism;

purging the sealed space with a dry gas; and performing precooling of the probe card by cold heat of the chuck top.

7. The method of claim 6, further comprising:

purging the sealed space with the dry gas in a state in which the probe card holder does not hold the probe card; and opening the sealed space, transferring the probe card to a location below the probe card holder, and causing the probe card to be held on the probe card holder, wherein the transferring the probe card includes transferring the chuck top to the location below the probe card after the probe card is held on the probe card holder.

* * * * *